(12) United States Patent
Sasaki

(10) Patent No.: US 10,916,594 B2
(45) Date of Patent: Feb. 9, 2021

(54) DISPLAY DEVICE INCLUDING A PLURALITY OF COLOR FILTERS AND A PLURALITY OF LIGHT EMITTING LAYERS

(71) Applicant: Japan Display Inc., Minato-ku (JP)

(72) Inventor: Tohru Sasaki, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/729,573

(22) Filed: Dec. 30, 2019

(65) Prior Publication Data

US 2020/0219940 A1 Jul. 9, 2020

(30) Foreign Application Priority Data

Jan. 7, 2019 (JP) .................................. 2019-000501

(51) Int. Cl.
*H01L 27/32* (2006.01)
*H01L 51/52* (2006.01)
*G06F 3/041* (2006.01)

(52) U.S. Cl.
CPC .......... *H01L 27/322* (2013.01); *G06F 3/0412* (2013.01); *H01L 27/323* (2013.01); *H01L 51/5246* (2013.01); *H01L 51/5253* (2013.01); *H01L 27/3209* (2013.01); *H01L 27/3218* (2013.01); *H01L 27/3244* (2013.01)

(58) Field of Classification Search
None
See application file for complete search history.

(56) References Cited

U.S. PATENT DOCUMENTS

| | | | |
|---|---|---|---|
| 2015/0270319 A1* | 9/2015 | Ishii | H01L 27/3246 257/40 |
| 2018/0130971 A1 | 5/2018 | Asozu et al. | |
| 2019/0005863 A1* | 1/2019 | Koshihara | H01L 27/322 |
| 2019/0013363 A1* | 1/2019 | Joo | H01L 27/326 |
| 2020/0066804 A1* | 2/2020 | Jung | H01L 27/323 |
| 2020/0212111 A1* | 7/2020 | Kim | H01L 51/5237 |

FOREIGN PATENT DOCUMENTS

JP 2018-077982 A 5/2018

* cited by examiner

*Primary Examiner* — J. E. Schoenholtz
(74) *Attorney, Agent, or Firm* — Oblon, McClelland, Maier & Neustadt, L.L.P.

(57) ABSTRACT

A plurality of light emitting layers are divided into a plurality of groups in response to light emitting colors. Each of the plurality of groups includes a group corresponding to the plurality of light emitting layers. Transmitted light colors of a plurality of filter layers are respectively the same type of colors as the light emitting colors of the plurality of light emitting layers. Each of the plurality of light emitting layers includes a central area and a peripheral area having mutually different light emitting characteristics within a range corresponding to a plurality of contact areas. Each of the plurality of filter layers includes a filter opening at the center, and is provided at least obliquely upward in an outward direction of the peripheral area.

21 Claims, 12 Drawing Sheets

DISPLAY DEVICE INCLUDING A PLURALITY OF COLOR FILTERS AND A PLURALITY OF LIGHT EMITTING LAYERS

CROSS-REFERENCE TO RELATED APPLICATION

The present application claims priority from Japanese patent application JP 2019-000501 filed on Jan. 7, 2019, the content of which is hereby incorporated by reference into this application.

BACKGROUND OF THE INVENTION

1. Field of the Invention

The present invention relates to a display device.

2. Description of the Related Art

Known is an organic electroluminescence display device in which a light emitting layer is separated for each light emitting color so that a pixel is formed of at least three sub-pixels of red, green, and blue (RGB) (JP 2018-77982 A). In such a structure, the light emitting color is slightly different between a peripheral edge part of each sub-pixel and a central area thereof. Further, a chromaticity change is different depending on an emission angle.

A difference in the chromaticity change caused by the emission angle causes a difference in display colors caused by a visual field angle. When measures are taken by providing a light shielding layer so as to cover the peripheral edge part of each sub-pixel, an amount of light that can be used is reduced, such that the luminance deteriorates. As disclosed in JP 2018-77982 A, when the measures are taken by arranging a color filter having the same color as the light emitting color of the sub-pixel in the whole pixel, the spectral transmittance of the color filter is less than 100%, such that the luminance also deteriorates.

SUMMARY OF THE INVENTION

An object of the present invention is to make a chromaticity change caused by a visual field angle inconspicuous.

The present invention provides a display device, including: a plurality of pixel electrodes; an electroluminescence layer including a plurality of light emitting layers respectively overlapping the plurality of pixel electrodes, and including a plurality of contact areas respectively in contact with the plurality of pixel electrodes; a common electrode provided on the electroluminescent layer; and a color filter layer including a plurality of filter layers respectively overlapping one corresponding to the plurality of light emitting layers and provided on the common electrode, wherein the plurality of light emitting layers are divided into a plurality of groups in response to light emitting colors, and each of the plurality of groups includes one group corresponding to the plurality of light emitting layers, transmitted light colors of the plurality of filter layers are respectively the same type of colors as the light emitting colors of the plurality of light emitting layers, each of the plurality of light emitting layers includes a central area and a peripheral area having mutually different light emitting characteristics within one range corresponding to the plurality of contact areas, and each of the plurality of filter layers includes a filter opening at the center, and is provided at least obliquely upward in an outward direction of the peripheral area.

According to the present invention, a chromaticity change caused by a visual field angle can be made inconspicuous by a color filter layer. Further, since each of the plurality of filter layers includes a filter opening at the center, there is little decrease in the amount of light or little deterioration in luminance.

DETAILED DESCRIPTION OF THE INVENTION

Hereinafter, an embodiment of the present invention will be described with reference to the drawings. However, the present invention can be implemented in various forms without departing from the scope of the invention, and is not construed as being limited to a description content of the embodiment described below.

In order to more clarify the description, the drawings may be schematically represented with respect to a width, a thickness, and a shape of each part in comparison with an actual form, but this is only an example and does not limit the interpretation of the present invention. In the specification and each drawing, an element having the same function as that described with reference to a previous drawing may be denoted by the same reference sign and redundant description thereof may be omitted.

In the detailed description of the present invention, when a positional relationship between one component and another component is defined, the term "on" and "under" shall include not only a case of being positioned directly above or directly below one component, but also a case of interposing another component therebetween, unless otherwise specified.

First Embodiment

Figure 1:
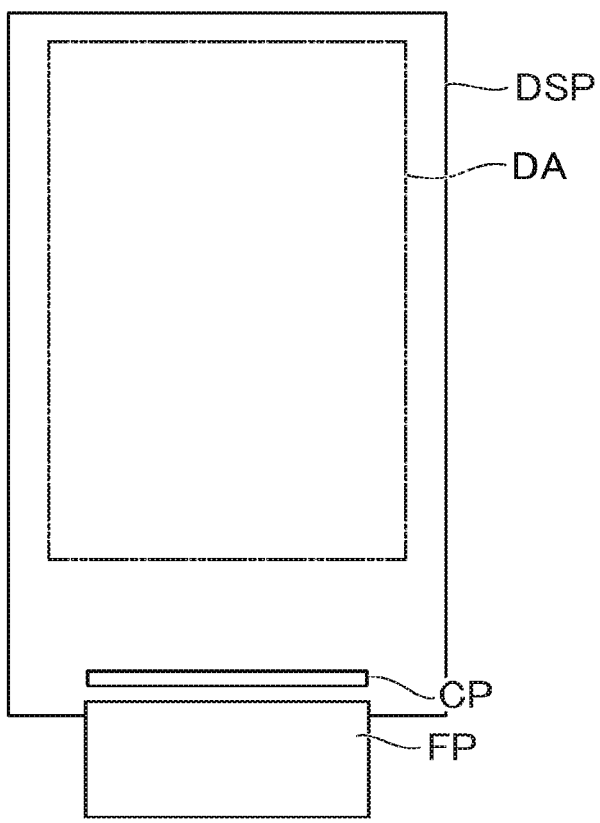
FIG. 1 is a plan view of a display device according to a first embodiment.
Figure 2:
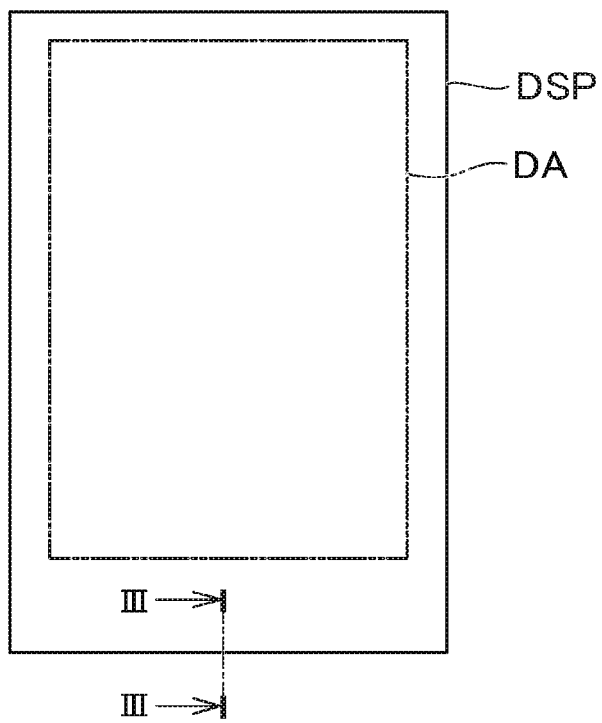
FIG. 2 is a schematic view illustrating a use state of the display device.
Figure 3:
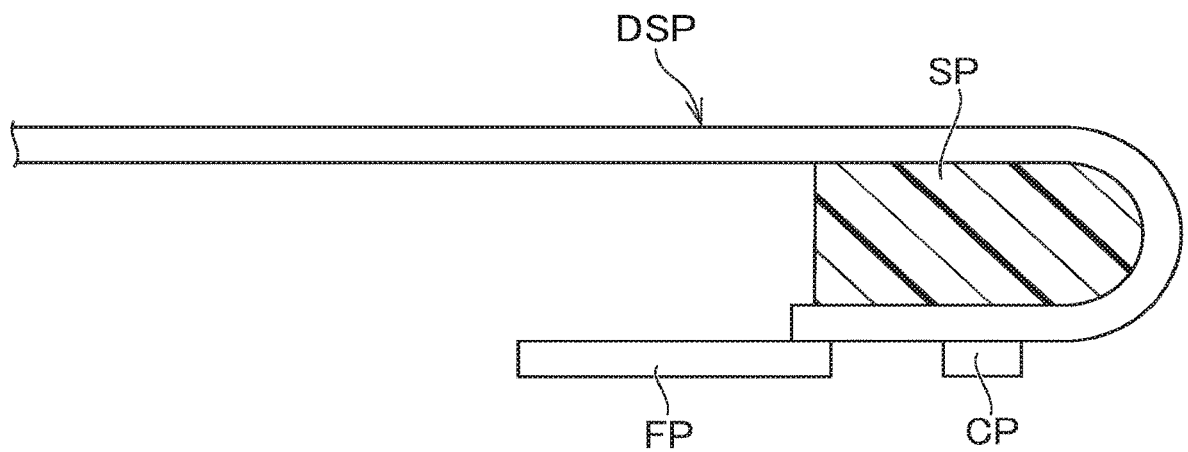
FIG. 3 is a schematic view of a cross section taken along the line of the display device illustrated in FIG. 2.

FIG. 1 is a plan view of a display device according to a first embodiment. Since the display device is actually used by being bent, FIG. 1 is a developed view before the display device is bent. FIG. 2 is a schematic view illustrating a use state of the display device. FIG. 3 is a schematic view of a cross section taken along the line of the display device illustrated in FIG. 2.

The display device includes a display DSP. A spacer SP is disposed inside the bending, thereby preventing the display DSP from being excessively bent. The display DSP has flexibility and is bent outside a display area DA. An integrated circuit chip CP for driving an element for displaying an image is mounted on the display DSP. A flexible printed substrate FP is connected to the display DSP outside the display area DA.

The display device is, for example, an organic electroluminescence display device. The display device includes the display area DA in which an image is displayed. In the display area DA, for example, a full color pixel is formed by combining unit pixels (sub-pixels) of a plurality of colors including red, green, and blue, and a full color image is displayed.

Figure 4:
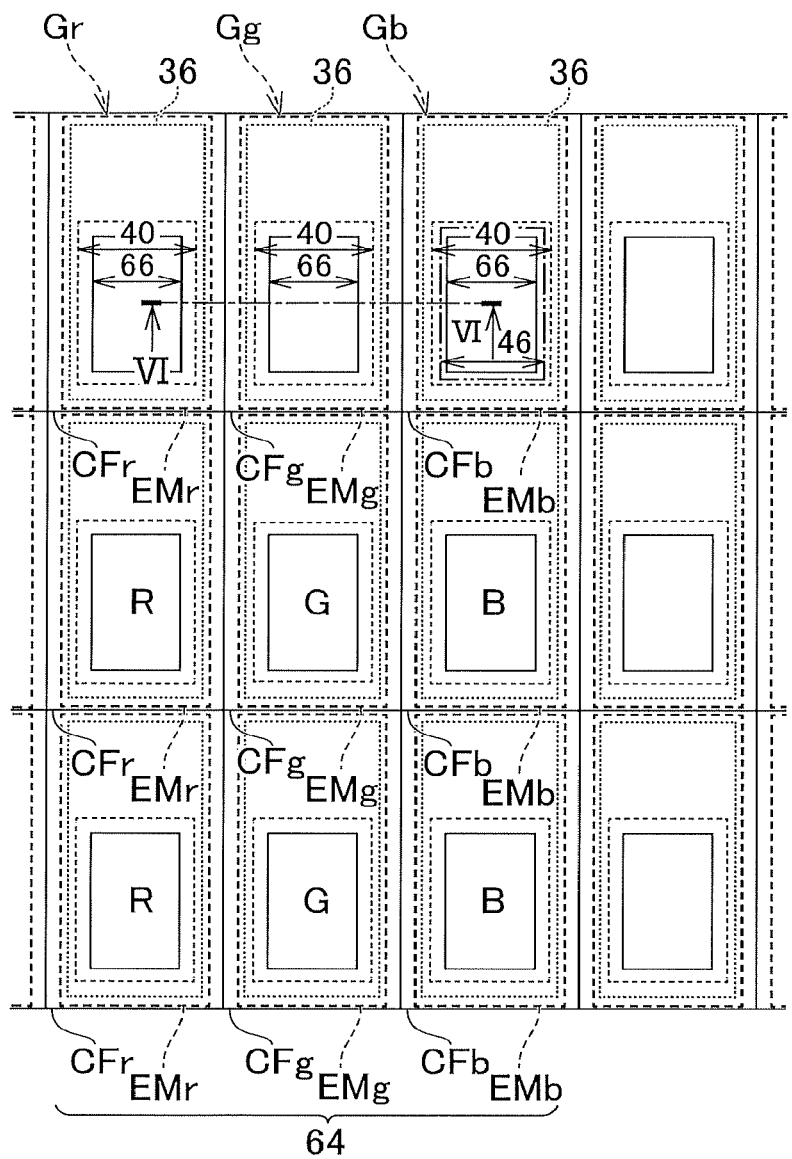
FIG. 4 is a partially enlarged view of a display area of the display device.
Figure 5:
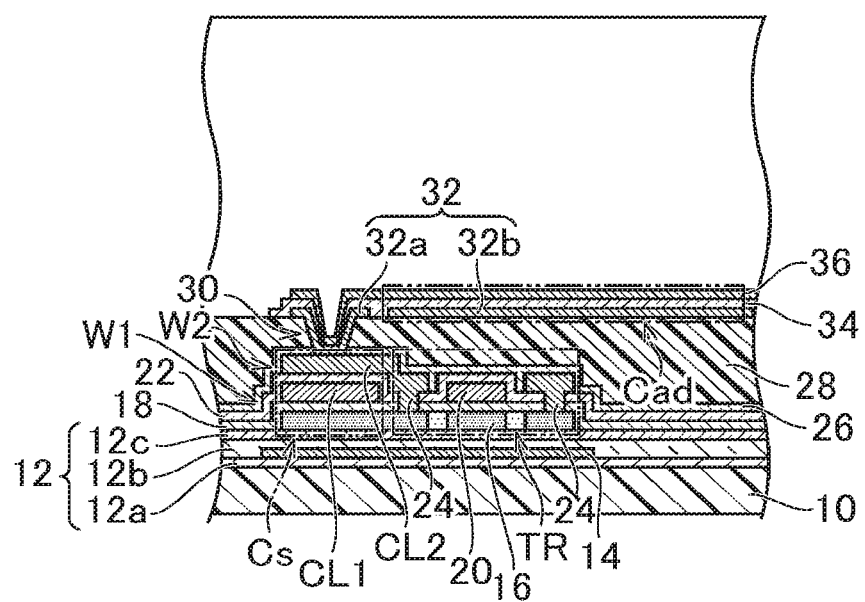
FIG. 5 is a cross-sectional view from a layer below an electroluminescent layer in the display area to a pixel electrode.

FIG. 4 is a partially enlarged view of the display area of the display device. FIG. 5 is a cross-sectional view from a layer below an electroluminescence layer or the like which will be described later inside the display area DA to a pixel electrode.

A substrate 10 is formed of a resin material such as polyimide. Other materials may be used as long as a base material has sufficient flexibility.

A barrier inorganic film 12 (undercoat film) is laminated on the substrate 10. The barrier inorganic film 12 has a three-layer laminated structure including a silicon oxide film 12a, a silicon nitride film 12b, and a silicon oxide film 12c. The lowermost silicon oxide film 12a is provided to improve adhesion with the substrate 10; the intermediate silicon nitride film 12b is provided as a block film of moisture and impurities from the outside; and the uppermost silicon oxide film 12c is provided as a block film so that a hydrogen atom contained in the silicon nitride film 12b is prevented from diffusing to the side of a semiconductor layer 16 of a thin film transistor TR, but particularly, the structure and the purpose are not limited thereto, and further layers may be laminated, or a single layer or a laminated layer having a double layer may be provided.

A functional film 14 may be formed in accordance with a location where the thin film transistor TR is formed. The functional film 14 can suppress a change in a characteristic of the thin film transistor TR caused by light intrusion from a back surface of a channel. Further, a conductive material is formed and a predetermined potential is applied, thereby making it possible to apply a back gate effect to the thin film transistor TR. Here, after the silicon oxide film 12a is formed, the functional film 14 is formed in an island shape in accordance with the location where the thin film transistor TR is formed, after which the silicon nitride film 12b and the silicon oxide film 12c are laminated, thereby forming the barrier inorganic film 12 so as to enclose the functional film 14. However, the above-described formation processing is not limited thereto, and the functional film 14 may be first formed on the substrate 10, after which the barrier inorganic film 12 may be formed thereon, or vice versa.

The thin film transistor TR is formed on the barrier inorganic film 12. As an example, a polysilicon thin film transistor is described and only a Nch transistor is illustrated here, but a Pch transistor may be simultaneously formed. The semiconductor layer 16 of the thin film transistor TR adopts a structure in which a low concentration impurity area is provided between a channel area and a source and drain area. Here, the silicon oxide film is used as a gate insulating film 18. A gate electrode 20 is a part of a first wiring layer W1 formed of a conductive material such as MoW. The first wiring layer W1 includes a first storage capacitance line CL1 in addition to the gate electrode 20. A part of a storage capacitance Cs is formed between the first storage capacitance line CL1 and the semiconductor layer 16 (source and drain area) via the gate insulating film 18.

An interlayer insulating film 22 is laminated on the gate electrode 20. As the interlayer insulating film 22, an inorganic insulating film such as a silicon oxide film and a silicon nitride film is used. A second wiring layer W2 including a portion that becomes a source and drain electrode 24 is formed on the interlayer insulating film 22. Here, a three-layer laminated structure of Ti, Al, and Ti is adopted, but the material is not limited thereto. Another part of the storage capacitance Cs is formed by the first storage capacitance line CL1 (a part of the first wiring layer W1) and the second storage capacitance line CL2 (a part of the second wiring layer W2) via the interlayer insulating film 22.

A passivation film 26 is formed on the interlayer insulating film 22 while covering the second wiring layer W2 (source and drain electrode 24). A planarization film 28 is provided on the passivation film 26. Since the planarization film 28 is superior in surface flatness in comparison with an inorganic insulating material formed by chemical vapor deposition (CVD) or the like, an organic material such as photosensitive acrylic is used.

A conductive film 32 is formed on the planarization film 28 and the passivation film 26. As the conductive film 32, for example, indium tin oxide (ITO) is used. The planarization film 28 and the passivation film 26 are removed at a pixel contact part 30. The conductive film 32 includes a first conductive film 32a and a second conductive film 32b separated from each other. The second wiring layer W2 whose surface is exposed by removing the planarization film 28 and the passivation film 26 is covered with the first transparent conductive film 32a. An inorganic insulating film 34 is provided on the planarization film 28 so as to cover the first conductive film 32a. As the inorganic insulating film 34, for example, a silicon nitride film is used. The inorganic insulating film 34 includes an opening in the pixel contact part 30, and a pixel electrode 36 is laminated so as to be electrically connected to the source and drain electrode 24 via the opening. The pixel electrode 36 is provided corresponding to one sub-pixel.

The pixel electrode 36 is formed as a reflective electrode and has a three-layer laminated structure of an indium oxide zinc film, an Ag film, and an indium oxide zinc film. Here, a conductive film such as an indium tin oxide film may be used instead of the indium zinc oxide film. The pixel electrode 36 extends laterally from the pixel contact part 30 and reaches above the thin film transistor TR.

The second conductive film 32b is provided adjacent to the pixel contact part 30 and below the pixel electrode 36 (further below the inorganic insulating film 34). The second conductive film 32b, the inorganic insulating film 34, and the pixel electrode 36 overlap each other, thereby forming an additional capacitance Cad.

Figure 6:
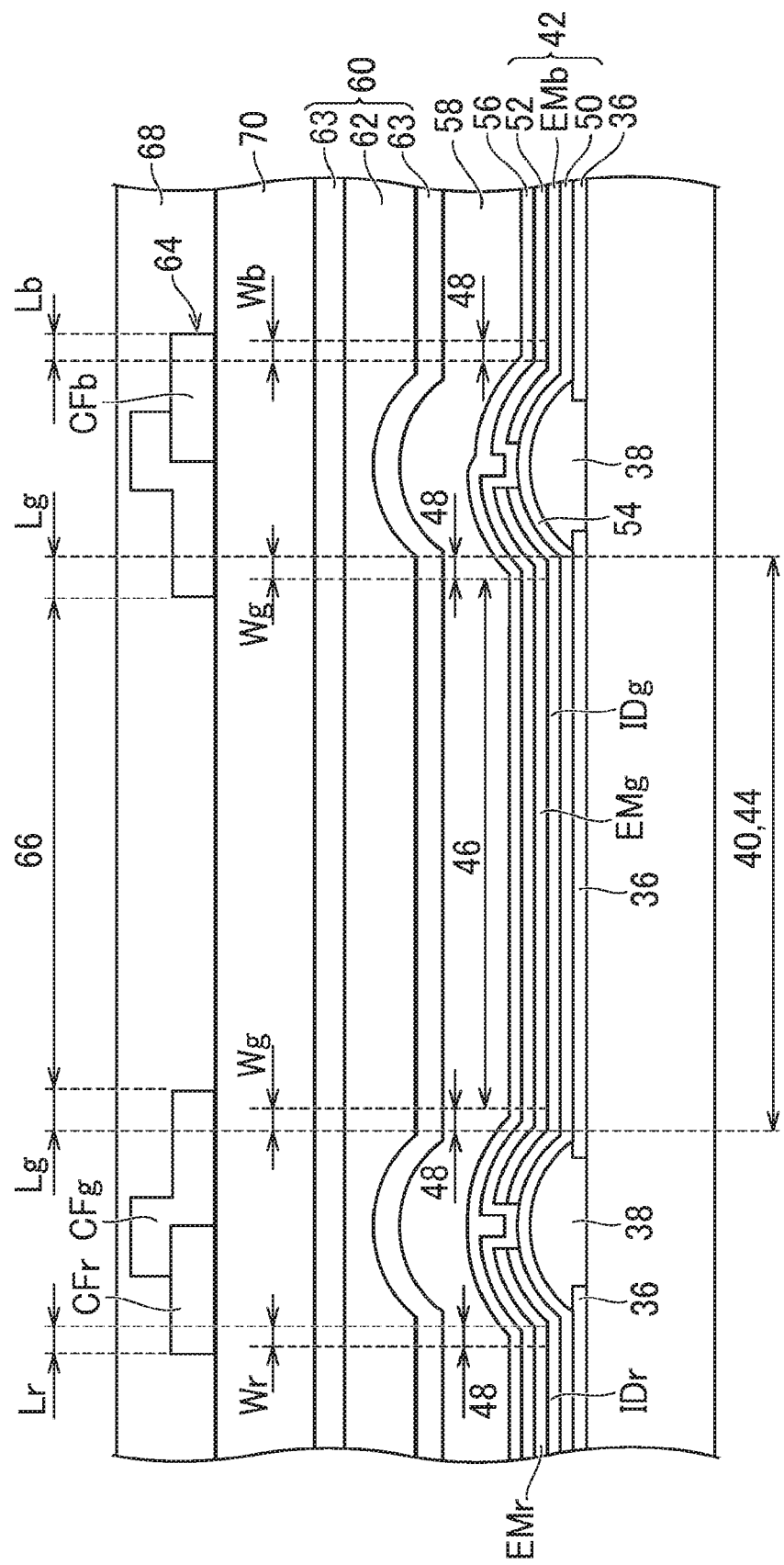
FIG. 6 is a cross-sectional view taken along the line VI-VI of the display device illustrated in FIG. 4.

FIG. 6 is a cross-sectional view taken along the line VI-VI of the display device illustrated in FIG. 4. An insulating layer 38 referred to as a bank (rib) and serving as a partition wall between adjacent pixel areas is formed on the planarization film 28. As the insulating layer 38, the organic material such as the photosensitive acrylic is used as in the planarization film 28, but an inorganic material may be used. The insulating layer 38 includes a plurality of insulating openings 40 so that the surfaces of the plurality of pixel electrodes 36 are exposed as light emitting areas. The insulating layer 38 covers a peripheral end part of each pixel electrode 36. It is desirable that an opening end part of the insulating opening 40 is formed in a forward tapered shape.

An electroluminescence layer 42 formed of the organic material is laminated on the plurality of pixel electrodes 36. The electroluminescence layer 42 incudes a plurality of contact areas 44 respectively contacting the plurality of pixel electrodes 36. The plurality of contact areas 44 overlap (or coincide with) the plurality of insulating openings 40 of the insulating layer 38. The electroluminescence layer 42 contacts the plurality of pixel electrodes 36 inside the plurality of insulating openings 40. The electroluminescence layer 42 is also formed on the insulating layer 38.

The electroluminescence layer 42 includes a plurality of light emitting layers EMr, EMg, and EMb. The plurality of light emitting layers EMr, EMg, and EMb overlap the plurality of pixel electrodes 36, respectively. Each of the light emitting layers EMr, EMg, and EMb includes a central area 46 and a peripheral area 48 surrounding the central area 46. The central area 46 and the peripheral area 48 are within one corresponding range of the plurality of contact areas 44.

The light emitting layers EMr, EMg, and EMb are patterned by vapor deposition using a mask. A vapor deposition material is formed to be thin near the peripheral area 48 because the vapor deposition material is hard to adhere therenear. Therefore, each of the light emitting layers EMr, EMg, and EMb is not uniform in thickness, and the peripheral area 48 is thinner than the central area 46.

When the thicknesses of the light emitting layers EMr, EMg, and EMb are different from each other, the luminance changes. In a structure provided with an optical resonator, since a length of the resonator changes due to the difference in the thicknesses of light emitting layers EMr, EMg, and EMb, and a wavelength at which interference to be strengthened occurs changes, a hue of the light is different. Among hue, brightness, and saturation which are three attributes of the color, the change in hue particularly has a great influence on image quality. That is, the light emitting characteristics of the central area 46 and the peripheral area 48 are different from each other.

The plurality of light emitting layers EMr, EMg, and EMb are divided into a plurality of groups Gr, Gg, and Gb in response to the light emitting colors as illustrated in FIG. 4. Here, the light emitting colors include red, green, and blue (R, G, and B), but may include other colors, and may be formed of two or more colors. The respective groups Gr, Gg, and Gb include a group corresponding to a plurality of light emitting layers EMr, EMg, and EMb. The blue light emitting layer EMb is 440 nm to 480 nm in a light emitting peak wavelength range. The green light emitting layer EMg is 510 nm to 570 nm in the light emitting peak wavelength range. The red light emitting layer EMr is 600 nm to 670 nm in the light emitting peak wavelength range. In the embodiment, a pair of light emitting layers EMr, EMg, and EMb adjacent to each other (a pair of blue light emitting layers EMb, a pair of green light emitting layers EMg, and a pair of red light emitting layers EMr) in the common groups Gr, Gg, and Gb are continuous (refer to FIG. 4). However, the arrangement of each light emitting layer is not limited thereto. In the respective groups Gr, Gg, and Gb, and at least one another group, the plurality of light emitting layers EMr, EMg, and EMb are different in widths Wr, Wg, and Wb that are provided from an outer edge of the peripheral area 48 to an inner edge thereof as illustrated in FIG. 6.

The electroluminescence layer 42 includes a first carrier injecting and transporting layer 50 and a second carrier injecting and transporting layer 52 for efficiently injecting and transporting a carrier below and above the light emitting layers EMr, EMg, and EMb, respectively. In the first carrier injecting and transporting layer 50 and the second carrier injecting and transporting layer 52, the positive and negative of the carrier to be injected and transported are reversed. When the pixel electrode 36 is an anode, the first carrier injecting and transporting layer 50 includes a positive hole injecting layer and a positive hole transporting layer, and the second carrier injecting and transporting layer 52 includes an electron injecting layer and an electron transporting layer.

The first carrier injecting and transporting layer 50 may include a thickness corresponding to the light emitting color of the light emitting layers EMr, EMg, and EMb in order to obtain a microcavity effect. That is, when the light generated in the light emitting layers EMr, EMg, and EMb is reflected by a reflection surface of the pixel electrode 36 and resonated, the thickness is adjusted to correspond to a wavelength of the light. In the embodiment, the first carrier injecting and transporting layer 50 includes a first common layer 54 formed of a carrier injecting layer and a carrier transporting layer. The plurality of contact areas 44 are provided on a lower surface of the first common layer 54 (carrier injecting layer). That is, the first common layer 54 and the pixel electrode 36 are in contact with each other in the contact area 44. The blue light emitting layer EMb is provided above and in contact with the first common layer 54. On the other hand, individual layers IDg and IDr formed of the carrier transporting layer are respectively interposed between the green and red light emitting layers EMr and EMg and the first common layer 54. The green individual layer IDg and the red individual layer IDr may have different thickness or may have the same thickness.

The second carrier injecting and transporting layer 52 (carrier injecting layer and carrier transporting layer) may have a uniform thickness regardless of the light emitting colors of the light emitting layers EMr, EMg, and EMb, or may have different thicknesses in response to the light emitting colors.

The respective layers forming the electroluminescence layer 42 may be formed by vapor deposition, may be formed by application on solvent dispersion, may be selectively formed with respect to the pixel electrodes 36 (each subpixel), or may be solidly formed on the whole surface covering the display area DA.

A common electrode 56 is provided on the electroluminescence layer 42. Here, since a top emission structure is adopted, the common electrode 56 is transparent. A transparent conductive film such as ITO and IZO is used as the common electrode. In addition, for example, an Mg layer and an Ag layer are formed as a thin film having a degree of allowing the emitted light from the electroluminescence layer 42 to pass therethrough. When the pixel electrode 36 is an anode, the common electrode 56 is a cathode. A light emitting element OD (refer to FIG. 7) is formed by the plurality of pixel electrodes 36, the common electrode 56, and the electroluminescence layer 42 interposed between a central part of each of the plurality of pixel electrodes 36 and the common electrode 56.

A cap layer 58 for improving light extraction efficiency may be laminated on the common electrode 56. A sealing layer 60 may be formed on the common electrode 56 or the cap layer 58. The sealing layer 60 uses the previously formed electroluminescence layer 42 as one function of preventing the moisture intrusion from the outside, and high gas barrier properties are required. In the embodiment, the sealing layer 60 has a laminated structure in which an organic layer 62 and a pair of inorganic layers 63 (for example, silicon nitride layers) sandwiching the organic layer 62 are laminated. The sealing layer 60 is not limited thereto, and may be formed as a single layer or may be formed as a laminated structure of two or more layers.

The display device includes a color filter layer 64. The color filter layer 64 includes a plurality of filter layers CFr, CFg, and CFb. The color filter layer 64 (filter layers CFr, CFg, and CFb) is provided above the common electrode 56. The color filter layer 64 may be formed by direct application to the substrate. Alternatively, a method for aligning and transferring the color filter layer 64 formed on another substrate may be applied.

The respective filter layers CFr, CFg, and CFb overlap one of the plurality of light emitting layers EMr, EMg, and EMb which is corresponding thereto in a plan view. Transmitted light colors of the respective filter layers CFr, CFg, and CFb are the same type of colors (for example, red, green, or blue) as the light emitting colors of the corresponding light emitting layers EMr, EMg, and EMb. The same type of color includes a combination of colors having the same hue and changing an element such as brightness and saturation, a combination of colors whose hues are adjacent to each other, and a combination of similar colors having different hues, and there may be also achromatic as the same type of color.

The blue filter layer CFb is 420 nm to 500 nm in a transmission wavelength range. The green filter layer CFg is 500 nm to 600 nm in the transmission wavelength range. The red filter layer CFr is 580 nm to 700 nm in the transmission wavelength range.

The respective filter layers CFr, CFg, and CFb overlap the peripheral areas 48 of the light emitting layers EMr, EMg, and EMb. The respective filter layers CFr, CFg, and CFb may overlap an end part of the central area 46 of the light emitting layers EMr, EMg, and EMb. A pair of adjacent ones of the plurality of filter layers CFr, CFg, and CFb different in the transmitted light colors have end parts overlapping each other (refer to FIG. 6). When there are a pair of adjacent ones of the plurality of filter layers CFr, CFg, and CFb common in the transmitted light colors, the pair thereof are continuous (refer to FIG. 4).

The respective filter layers CFr, CFg, and CFb include a filter opening 66 at the center. The respective filter layers CFr, CFg, and CFb have lengths Lr, Lg, and Lb (length from an opening end of the filter opening 66 to just above the outer edge of the peripheral area 48) corresponding to sizes of the widths Wr, Wg, and Wb of the peripheral area 48 of the light emitting layers EMr, EMg, and EMb. The opening end of the filter opening 66 is in the central area 46 in a plan view. That is, end parts of the widths Wr, Wg, and Wb on the side of the central area 46 respectively overlap the filter layers CFr, CFg, and CFb in the plan view. The respective filter layers CFr, CFg, and CFb are provided at least obliquely above the peripheral area 48 in an outward direction.

According to the embodiment, the color filter layer 64 can make a chromaticity change caused by a visual field angle inconspicuous. That is, the light emission from the peripheral area 48 and the light emission from the central area 46 have different chromaticity, but the color filter layer 64 adjusts the light emitting luminance and the chromaticity from the peripheral area 48, thereby improving display performance. For example, as compared with a case where the color filter layer 64 is not provided, it is possible to suppress a variation in the light emitting chromaticity emitted outside the display device. Further, as compared with a case where a light shielding layer (black matrix layer) is provided at a pixel boundary as in a liquid crystal display device, deterioration in the luminance can be suppressed. Since the filter layers CFr, CFg, and CFb include the filter opening 66 at the center, there is little decrease in the amount of light or little deterioration in the luminance.

The color filter layer 64 (filter layers CFr, CFg, and CFb) is covered with a protective layer 68. The protective layer 68 has transparency. The protective layer 68 may include a polarizing plate (for example, a circular polarizing plate). A touch sensing layer 70 provided with a sensor electrode for touch sensing may be interposed between the electroluminescence layer 42 and the color filter layer 64.

Figure 7:
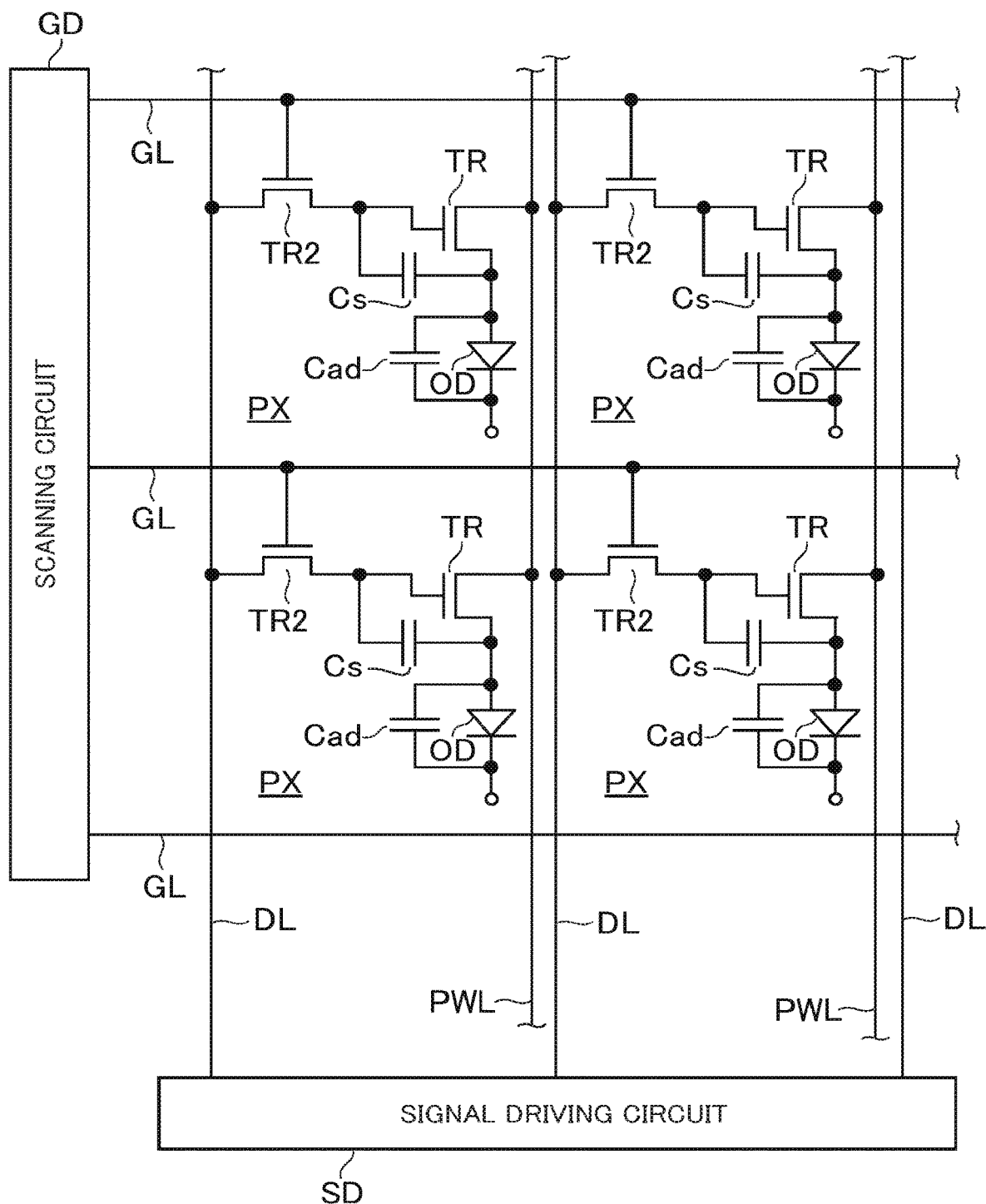
FIG. 7 is a circuit diagram of the display device illustrated in FIG. 1.

FIG. 7 is a circuit diagram of the display device illustrated in FIG. 1. The circuit includes a plurality of scanning lines GL connected to a scanning circuit GD and a plurality of signal lines DL connected to a signal driving circuit SD. The signal driving circuit SD is disposed in the integrated circuit chip CP illustrated in FIG. 1. In the circuit, an area surrounded by two adjacent scanning lines GL and two adjacent signal lines DL is included in one pixel PX. The pixel PX includes a thin film transistor TR as a driving transistor, a thin film transistor TR2 as a switch, and the storage capacitance Cs. When a gate voltage is applied to the scanning line GL, the thin film transistor TR2 is turned on, a video signal is supplied from the signal line DL, and electric charge is stored in the storage capacitance Cs. When the electric charge is stored in the storage capacitance Cs, the thin film transistor TR is turned on, and a current flows from a power line PWL to the light emitting element OD. The light emitting element OD emits light by this current.

Second Embodiment

Figure 8:
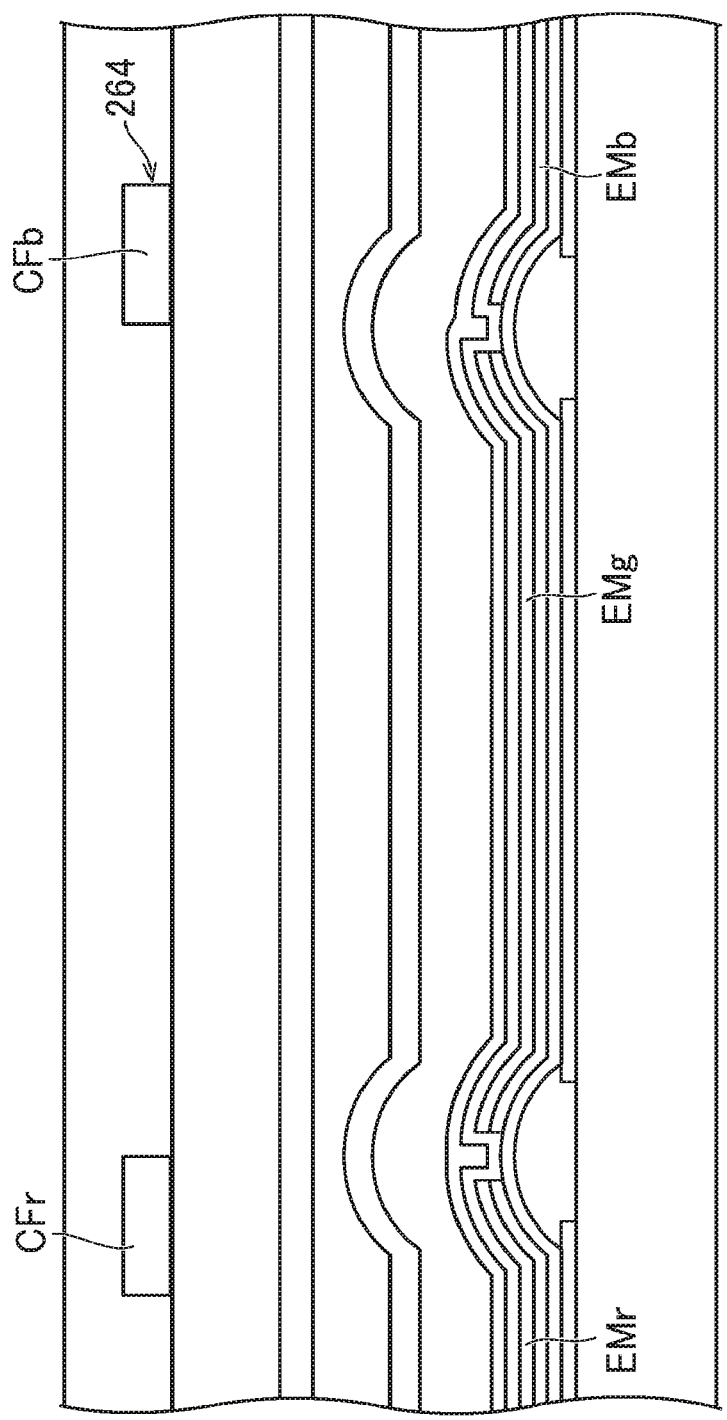
FIG. 8 is a cross-sectional view of a display device according to a second embodiment.

FIG. 8 is a cross-sectional view of a display device according to a second embodiment. In the embodiment, a color filter layer 264 avoids overlapping a group corresponding to the plurality of light emitting layers EMr, EMg, and EMb included in at least one of the plurality of groups Gr, Gg, and Gb (refer to FIG. 4). For example, the filter layers CFr and CFb corresponding to the red and blue light emitting layers EMr and EMb are provided, but the filter layer corresponding to the green light emitting layer EMg is not provided. Since the green light is relatively hard to feel the chromaticity change, the filter layer is eliminated and securing the amount of light and the luminance is prioritized. Other contents correspond to the contents described in the first embodiment.

Third Embodiment

Figure 9:
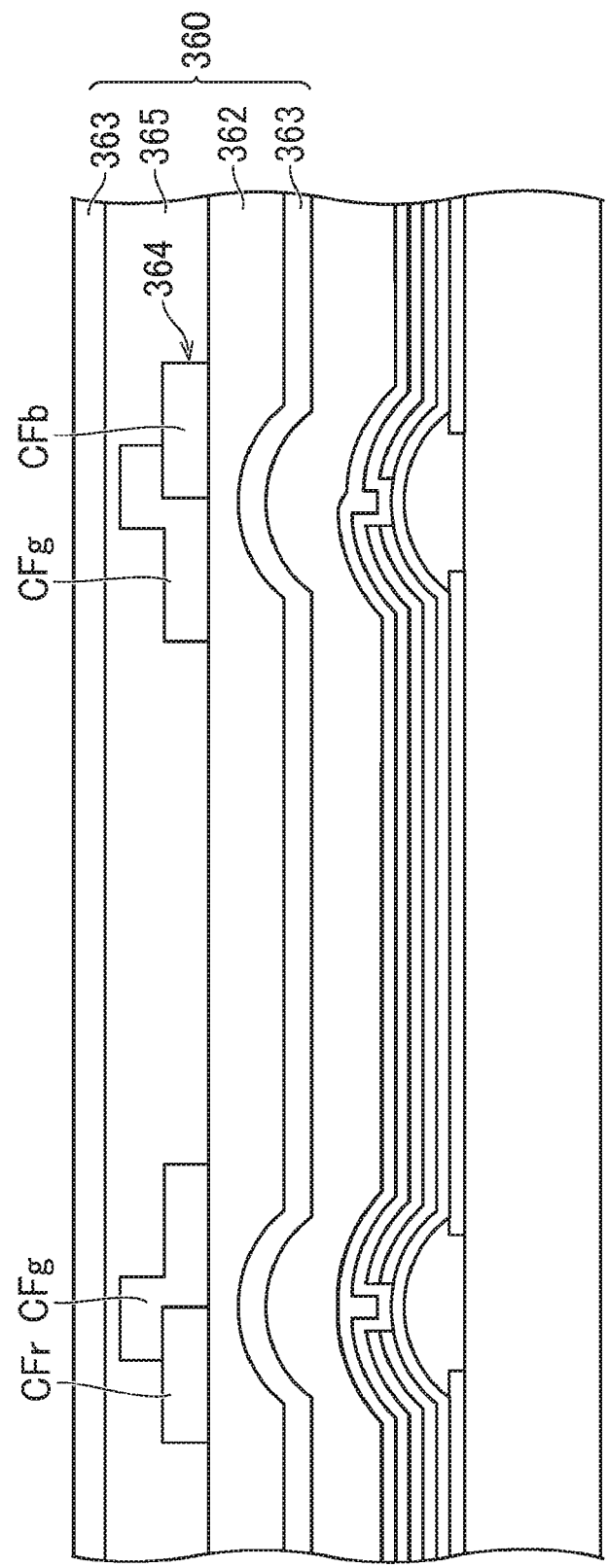
FIG. 9 is a cross-sectional view of a display device according to a third embodiment.

FIG. 9 is a cross-sectional view of a display device according to a third embodiment. In the embodiment, a color filter layer 364 is provided inside a sealing layer 360. Specifically, the color filter layer 364 (filter layers CFr, CFg, and CFb) is sandwiched between an organic layer 362 and an organic layer 365 and is further sandwiched between a pair of inorganic layers 363 on the outside thereof. The organic layer 362 and the organic layer 365 may be formed of the same material or different materials. Other contents correspond to the contents described in the first embodiment.

Fourth Embodiment

Figure 10:
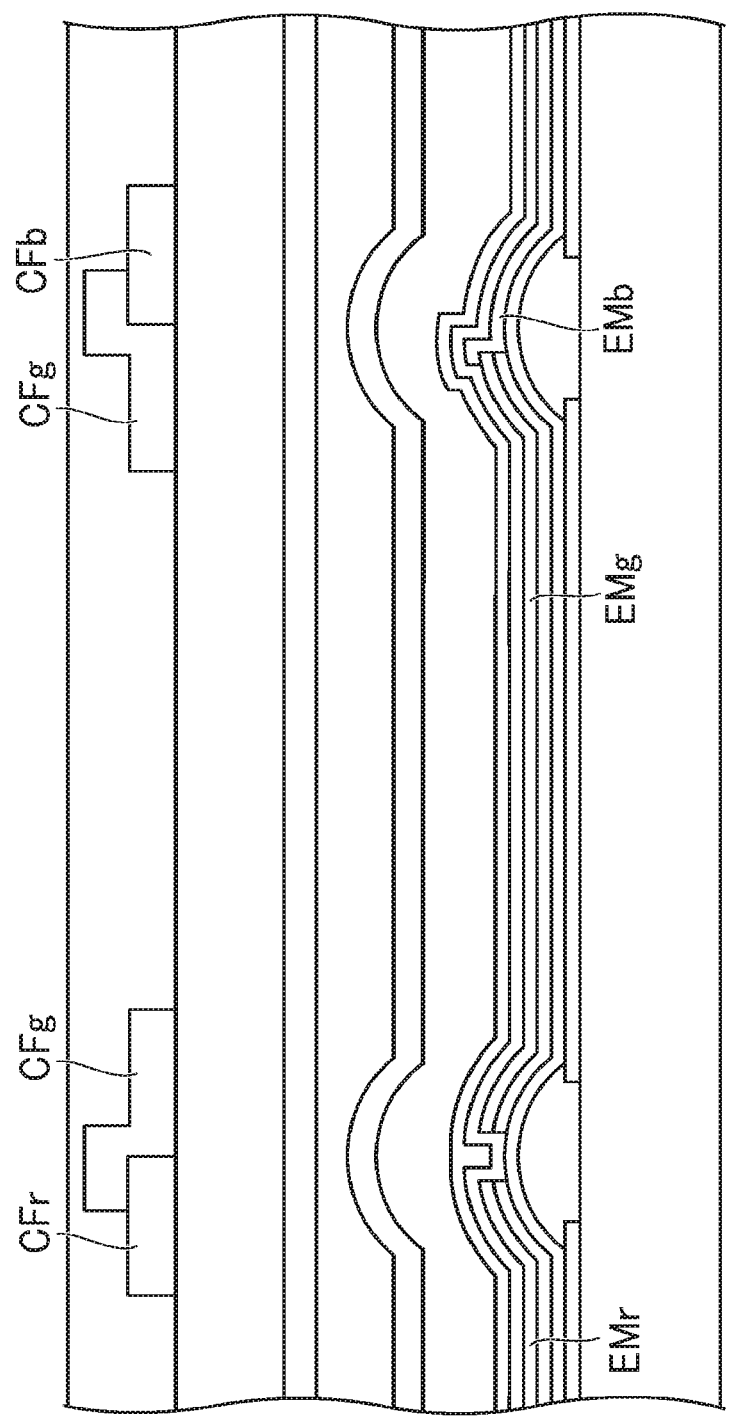
FIG. 10 is a cross-sectional view of a display device according to a fourth embodiment.

FIG. 10 is a cross-sectional view of a display device according to a fourth embodiment. In the embodiment, the end parts of the pair of light emitting layers EMg and EMb overlap each other. The pair of light emitting layers EMg and EMb whose end parts overlap each other are included in different pair of the plurality of groups Gg and Gb (refer to FIG. 4) and are adjacent to each other. Such overlapping is caused by positional deviation when the light emitting layers EMr, EMg, and EMb are formed by the vapor deposition. When the light emitting layer EMg emits light, the end part on the side of the light emitting layer EMg of the light emitting layer EMb that should not emit light may emit light under the electrical influence (so-called electric color mixture occurs). According to the embodiment, since the unexpected light emission is absorbed by the filter layer CFg, it is possible to reduce the influence on display quality caused by the color mixture. Other contents correspond to the contents described in the first embodiment.

Fifth Embodiment

Figure 11:
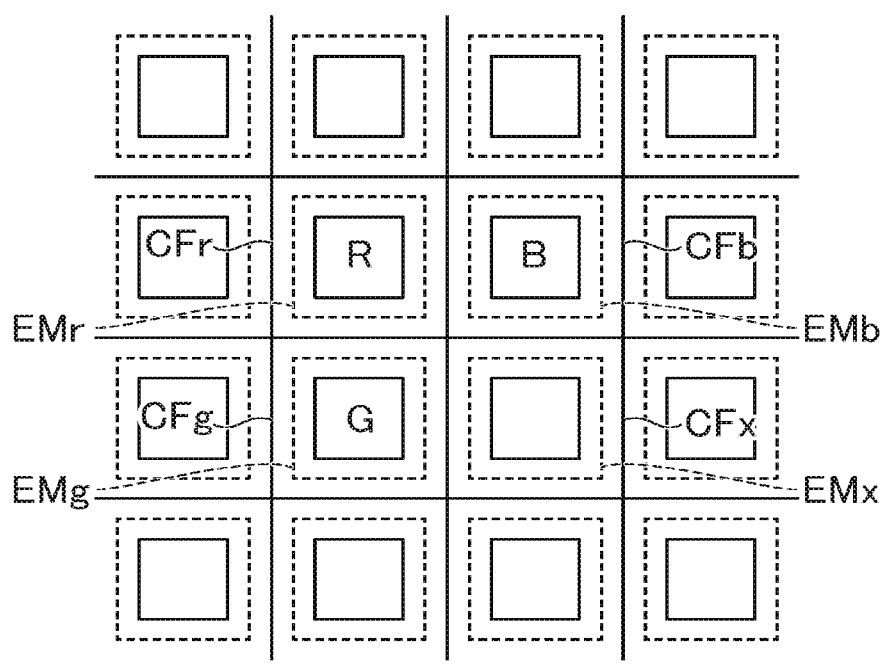
FIG. 11 is a cross-sectional view of a display device according to a fifth embodiment.

FIG. 11 is a cross-sectional view of a display device according to a fifth embodiment. The display device includes an additional light emitting layer EMx and an additional filter layer CFx in addition to the light emitting layers EMr, EMg, and EMb and the filter layers CFr, CFg, and CFb of the three primary colors of light, red, green, and blue (R, G, B).

When the light emitting color of the additional light emitting layer EMx is yellow, a light emitting peak wavelength range is 510 nm to 670 nm. In that case, the transmitted light color of the additional filter layer CFx is also the same type of color (yellow), and the transmission wavelength range is 500 nm to 700 nm.

Figure 12:
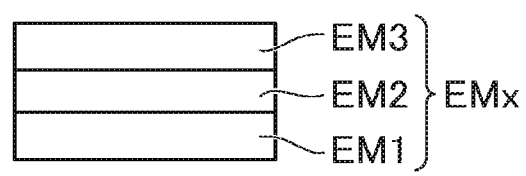
FIG. 12 is a cross-sectional view of an additional light emitting layer illustrated in FIG. 11.

FIG. 12 is a cross-sectional view of the additional light emitting layer EMx illustrated in FIG. 11. In this example, the additional light emitting layer EMx includes a plurality of layers EM1, EM2, and EM3 that have a white light emitting color and are different from each other in the light emitting peak wavelength range (light emitting color). White is an achromatic color in which light of all the wavelengths of visible light is uniformly mixed, but the light emitting color of white may actually have slight saturation (red, green, or blue).

When the light emitting color of the additional light emitting layer EMx is white, the transmitted light color of the additional filter layer CFx illustrated in FIG. 11 is also the same type of color (white). The additional filter layer CFx includes wavelength areas respectively covering red, green, and blue in the transmission wavelength range. Each of the wavelength areas and at least one of the other wavelength areas are different in transmittance. Accordingly, the transmitted light color of the additional filter layer CFx can be made to be the same type of color as the light emitting color of the additional light emitting layer EMx.

While there have been described what are at present considered to be certain embodiments, it will be understood that various modifications may be made thereto, and it is intended that the appended claims cover all such modifications as fall within the true spirit and scope of the invention.

What is claimed is:

1. A display device comprising:
   a plurality of pixel electrodes;
   an electroluminescence layer including a plurality of light emitting layers respectively overlapping the plurality of pixel electrodes, and including a plurality of contact areas respectively in contact with the plurality of pixel electrodes;
   a common electrode provided on the electroluminescent layer; and
   a color filter layer including a plurality of filter layers respectively overlapping one corresponding to the plurality of light emitting layers and provided on the common electrode, wherein
   the plurality of light emitting layers are divided into a plurality of groups in response to light emitting color, and each of the plurality of groups includes one group corresponding to the plurality of light emitting layers,
   transmitted light colors of the plurality of filter layers are respectively the same type of colors as the light emitting colors of the plurality of light emitting layers,
   each of the plurality of light emitting layers includes a central area and a peripheral area within a corresponding one of the plurality of contact areas, and
   each of the plurality of filter layers includes a filter opening at the center, and is provided at least obliquely upward in an outward direction of the peripheral area.

2. The display device according to claim 1, wherein each of the plurality of filter layers overlaps the peripheral area.

3. The display device according to claim 1, wherein each of the plurality of filter layers overlaps an end part of the central area.

4. The display device according to claim 1, further comprising:
   an insulating layer including a plurality of insulating openings that respectively overlap the plurality of contact areas and placed on respective peripheral end parts of the plurality of pixel electrodes, wherein
   the electroluminescent layer contacts the plurality of pixel electrodes inside the plurality of insulating openings and is placed on the insulating layer.

5. The display device according to claim 1, wherein in each of the plurality of groups and at least one of the other groups, each group corresponding to the plurality of light emitting layers has a different width from an outer edge of the peripheral area to an inner edge thereof.

6. The display device according to claim 5, wherein each of the plurality of filter layers includes a length from an opening end of the filter opening to an immediately upper outer edge of the peripheral area in response to a size of the width of the peripheral area.

7. The display device according to claim 1, wherein the color filter layer avoids overlapping the one group corresponding to the plurality of light emitting layers included in at least one of the plurality of groups.

8. The display device according to claim 1, further comprising:
   a sealing layer for sealing the electroluminescence layer, wherein
   the plurality of filter layers are provided on the sealing layer.

9. The display device according to claim 1, further comprising:
   a sealing layer for sealing the electroluminescence layer, wherein
   the plurality of filter layers are provided inside the sealing layer.

10. The display device according to claim 1, further comprising:
    a protective layer covering the plurality of filter layers.

11. The display device according to claim 1, further comprising:
    a touch sensing layer interposed between the electroluminescence layer and the color filter layer for touch sensing.

12. The display device according to claim 1, wherein
a pair of adjacent ones of the plurality of light emitting layers, each of which is included in a different pair of the plurality of groups, have end parts overlapping each other.

13. The display device according to claim 1, wherein
a pair of adjacent ones of the plurality of filter layers different in the transmitted light colors have end parts overlapping each other.

14. The display device according to claim 1, wherein
a pair of adjacent ones of the plurality of light emitting layers, each of which is included in a common one of the plurality of groups, are continuous.

15. The display device according to claim 1, wherein
a pair of adjacent ones of the plurality of filter layers common in the transmitted light colors are continuous.

16. The display device according to claim 1, wherein
the light emitting colors include red, green and blue,
each group of the plurality of light emitting layers corresponding to the blue is 440 nm to 480 nm in a light emitting peak wavelength range,
each group of the plurality of light emitting layers corresponding to the green is 510 nm to 570 nm in the light emitting peak wavelength range, and
each group of the plurality of light emitting layers corresponding to the red is 600 nm to 670 nm in the light emitting peak wavelength range.

17. The display device according to claim 16, wherein
the light emitting colors further include yellow, and
each group of the plurality of light emitting layers corresponding to the yellow is 510 nm to 670 nm in the light emitting peak wavelength range.

18. The display device according to claim 16, wherein
the light emitting colors further include white, and
each group of the plurality of light emitting layers corresponding to the white includes a plurality of layers different from each other in the light emitting peak wavelength range.

19. The display device according to claim 16, wherein
the transmitted light colors include red, green, and blue,
each group of the plurality of filter layers corresponding to the blue is 420 nm to 500 nm in a transmission wavelength range,
each group of the plurality of filter layers corresponding to the green is 500 nm to 600 nm in the transmission wavelength range, and
each group of the plurality of filter layers corresponding to the red is 580 nm to 700 nm in the transmission wavelength range.

20. The display device according to claim 19, wherein
the transmitted light colors further include yellow, and
each group of the plurality of filter layers corresponding to the yellow is 500 nm to 700 nm in the transmission wavelength range.

21. The display device according to claim 19, wherein
the transmitted light colors further include white,
each group of the plurality of filter layers corresponding to the white includes a wavelength area that respectively covers the blue, the green, and the red in the transmission wavelength range, and
transmittance is different between each of the wavelength areas and at least one other area.

* * * * *